(12) United States Patent
Yoo et al.

(10) Patent No.: US 8,773,915 B2
(45) Date of Patent: Jul. 8, 2014

(54) SEMICONDUCTOR MEMORY DEVICE AND OPERATING METHOD THEREOF

(75) Inventors: Byoung Sung Yoo, Seoul (KR); Jin Su Park, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 109 days.

(21) Appl. No.: 13/616,078

(22) Filed: Sep. 14, 2012

(65) Prior Publication Data
US 2013/0163331 A1    Jun. 27, 2013

(30) Foreign Application Priority Data
Dec. 22, 2011    (KR) ........................ 10-2011-0140198

(51) Int. Cl.
*G11C 16/06*    (2006.01)

(52) U.S. Cl.
USPC ............. 365/185.22; 365/185.11; 365/185.24

(58) Field of Classification Search
USPC ............. 365/185.11, 185.12, 185.17, 185.18, 365/185.19, 185.22, 185.24, 185.29
See application file for complete search history.

(56) References Cited

U.S. PATENT DOCUMENTS

| | | | |
|---|---|---|---|
| 5,928,370 A * | 7/1999 | Asnaashari ..................... 714/48 |
| 5,965,477 A * | 10/1999 | Sivaram et al. ............... 502/107 |
| 7,068,540 B2 * | 6/2006 | Micheloni et al. ........ 365/185.19 |
| 7,317,638 B2 * | 1/2008 | Guterman et al. ........ 365/185.22 |
| 7,663,914 B2 * | 2/2010 | Lee .......................... 365/185.03 |

* cited by examiner

*Primary Examiner* — Gene Auduong
(74) *Attorney, Agent, or Firm* — William Park & Associates Patent Ltd.

(57) ABSTRACT

A semiconductor memory device and a method of operating the same results in reduced programming time. The semiconductor memory device includes advanced circuitry that enables reductions in programming and verification times, leading to a substantial reduction in the total time required to program the device.

37 Claims, 9 Drawing Sheets

SEMICONDUCTOR MEMORY DEVICE AND OPERATING METHOD THEREOF

CROSS-REFERENCE TO RELATED APPLICATION

This application claims priority from Korean Patent Application No. 10-2011-0140198, filed on Dec. 22, 2011, the contents of which are incorporated herein by reference in its entirety.

BACKGROUND

The present invention relates to a semiconductor memory device and an operating method thereof, and in particular to a semiconductor memory device having reduced programming time and an operating method thereof.

The number of electrons trapped in a floating gate decreases as gate dimensions become smaller. Because of this, a program operation may pass only when a higher program voltage is applied in a program verifying operation. For example, if the program operation passes when the fifth program pulse is applied in a 32 nm process, the program operation will pass when the tenth program pulse is applied in a 20 nm process. This is a physical phenomenon that is observed as the length of the gate of a memory cell decreases.

Accordingly, a need arises for a semiconductor memory device having reduced programming time, especially in view of the above phenomenon.

SUMMARY OF THE INVENTION

An example embodiment of the present invention stores the number of program cycles performed until a verifying operation based on a first verifying operation is passed in a test operation, and does not perform an all pass checking operation until the number of program cycles performed in a program operation reaches the stored number of program cycles, thereby reducing programming time.

A method of operating a semiconductor memory device according to a first embodiment of the present invention includes performing a first program loop, including a first program operation and a first verify operation, on memory cells in a first page; performing a first checking operation for verifying whether threshold voltage of the memory cells in the first page is greater than a target voltage when the number of first program loops exceeds a first iteration number; and performing a second checking operation for verifying the number of memory cells having a threshold voltage lower than the target voltage in the event that the first checking operation detects any memory cells having a threshold voltage lower than the target voltage.

A method of operating a semiconductor memory device according to a second embodiment of the present invention includes performing a first program loop, including a first program operation and first through third verify operations, on memory cells in a first page; performing a first checking operation for verifying whether threshold voltage of first memory cells among the memory cells is greater than a first verifying voltage as a target voltage, and a second checking operation for verifying whether threshold voltage of second memory cells among the memory cells is greater than a second verifying voltage as a target voltage when the number of first program loops exceeds a first iteration number; and performing a third checking operation for verifying the number of memory cells having a threshold voltage lower than a corresponding target voltage of the first memory cells, the second memory cells and third memory cells corresponding to a third verifying voltage as a target voltage when the number of first program loops exceeds a second iteration number.

A method of operating a semiconductor memory device according to a third embodiment of the present invention includes performing a first program operation and a first verify operation, based on first through seventh verifying voltages, on memory cells in a first page; performing first to sixth checking operations for verifying whether the threshold voltage of first to sixth memory cells of the memory cells is greater than the first to the sixth verifying voltage as a target voltages, when the number of first program loops exceeds a first iteration number; and performing a seventh checking operation for verifying the number of a memory cell having threshold voltage lower than the corresponding target voltage of the first to the sixth memory cells, and seventh memory cells, corresponding to a seventh verifying voltage as a target voltage, when the number of first program loops exceeds a second iteration number.

A semiconductor memory device according to a first embodiment of the present invention includes a memory block with a plurality of memory cells; a peripheral circuit configured to perform a first program loop including a first program operation and a first verifying operation on memory cells in a first page of the memory cells; and a control circuit configured to control the peripheral circuit for performing a first checking operation for verifying whether threshold voltage of the memory cells in the first page is greater than a target voltage when the number of first program loops exceeds a first iteration number, and performing a second checking operation for verifying the number of memory cells having a threshold voltage lower than the target voltage in the event that the first checking operation detects any memory cells having a threshold voltage lower than the target voltage.

A semiconductor memory device according to a second embodiment of the present invention includes a memory block having memory cells; a peripheral circuit configured to perform a first program loop, including a first program operation and a first verify operation based on first through third verifying voltages, on memory cells in a first page of the memory cells; and a control circuit configured to control the peripheral circuit to perform a first checking operation for verifying whether the threshold voltage of first memory cells among the memory cells is greater than a first verifying voltage as a target voltage, and a second checking operation for verifying whether threshold voltage of second memory cells among the memory cells is greater than a second verifying voltage as a target voltage, when the number of first program loops exceeds a first iteration number, and performing a third checking operation for verifying the number of memory cells having a threshold voltage lower than the third verifying voltage as a corresponding target voltage of the first memory cells, the second memory cells and third memory cells, when the number of first program loops exceeds a second iteration number.

A semiconductor memory device according to a third embodiment of the present invention includes memory cells coupled to a word line; page buffers coupled to the memory cells through a bit line, configured to temporarily store verifying data obtained by sensing program state of a corresponding memory cell and control potential of a sensing node according to the verifying data; a first checking circuit configured to output the verifying data to a verifying terminal, in response to receiving a first checking signal, when the number of program operations exceeds a first iteration number; and a second checking circuit configured to verify completion of the program operation through the verifying data in response to a second checking signal.

An embodiment of the present invention stores the number of program loops in a program operation performed until a verifying operation, based on a first verifying operation, is passed in a test operation, and does not perform an all pass checking operation until the number of program loops performed in a program operation reaches a stored iteration number, thereby reducing programming time.

Additionally, the present embodiment directly performs an error bit checking operation without performing a third checking operation for determining whether threshold voltage of every memory cell in a corresponding page is greater than a third verifying voltage, when a verifying operation based on a second verifying voltage is passed, thereby reducing programming time.

The present embodiment may reduce timing overhead of a controller in the event that a controller is included in a memory chip.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION

Hereinafter, embodiments of the present invention will be explained in more detail with reference to the accompanying drawings. Although the present invention is described with reference to a number of example embodiments thereof, it should be understood that numerous other modifications and embodiments can be devised by those skilled in the art that will fall within the spirit and scope of the invention.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Figure 1:
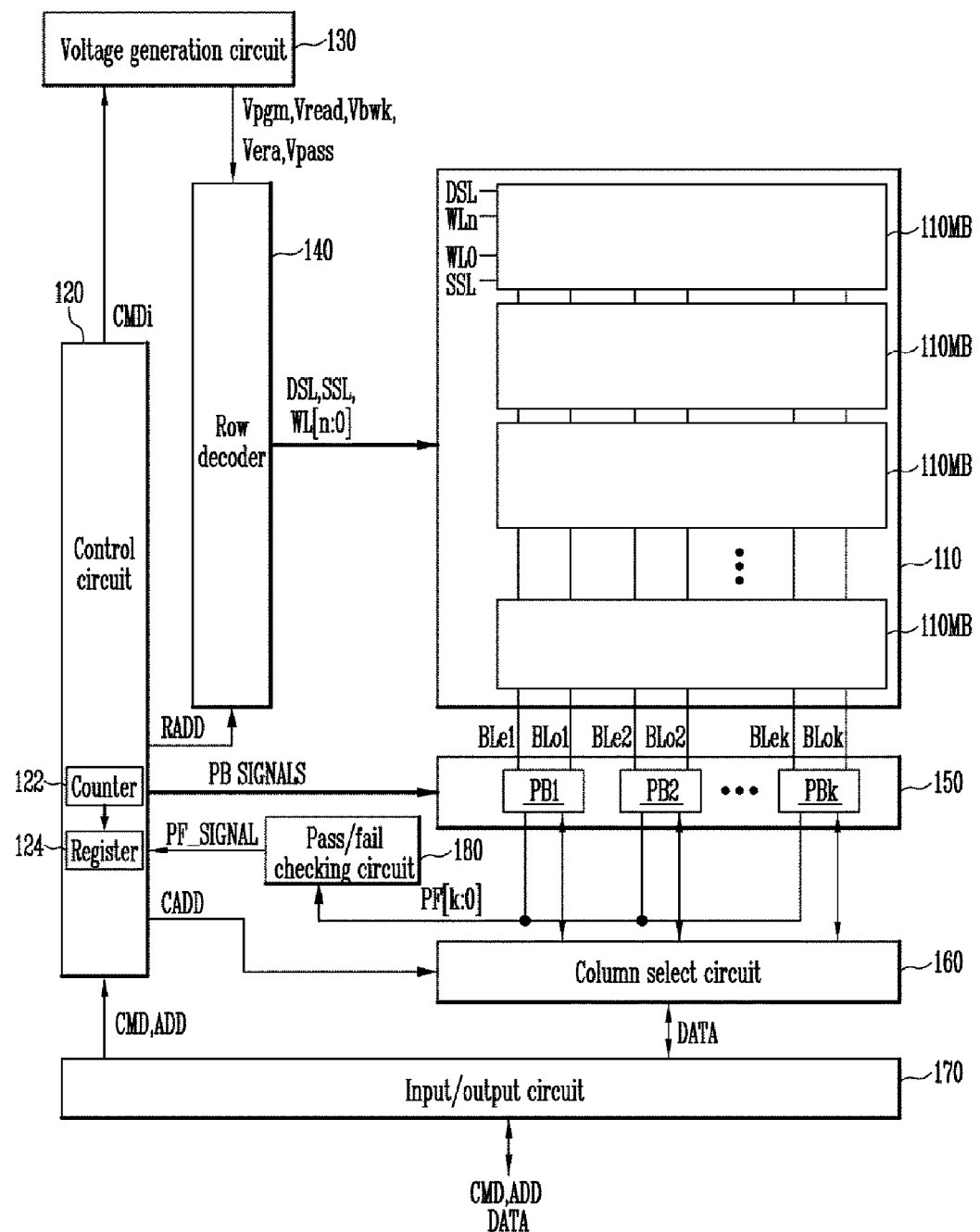
FIG. 1 illustrates circuitry of a semiconductor memory device according to an embodiment of the present invention.

FIG. 1 illustrates circuitry of a semiconductor memory device according to an embodiment of the present invention. While FIG. 2 illustrates circuitry of a memory block of FIG. 1 in greater detail.

A semiconductor memory device in accordance with an embodiment includes a memory array 110 having memory blocks 110MB, operation circuits 130, 140, 150, 160, 170, and 180 for performing program operations, read operations, and test operations for memory cells included in a selected page of the memory block 110MB, and a control circuit 120 for controlling the operation circuits 130, 140, 150, 160, 170, and 180. In the event that the semiconductor memory device is a NAND flash memory device, the operation circuits include a voltage supplement circuit 130, 140, a page buffer group 150, a column select circuit 160, an input/output circuit 170, and a pass/fail checking circuit 180.

The memory array 110 includes the memory blocks 110MB.

Figure 2:
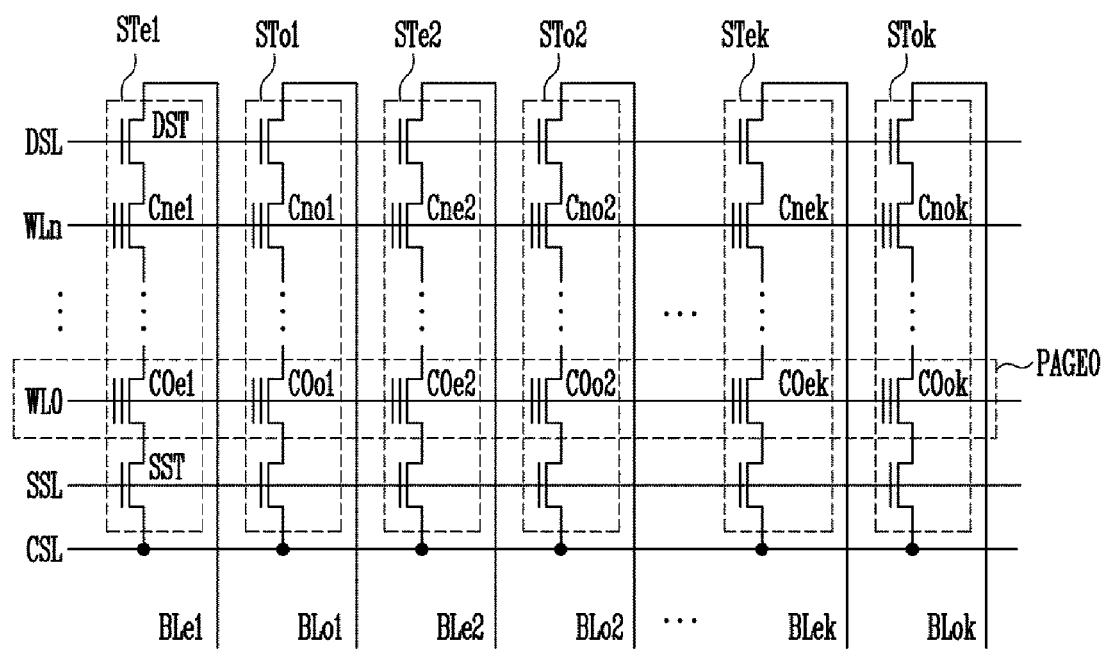
FIG. 2 illustrates circuitry of a memory block of FIG. 1 in greater detail.

In FIG. 2, each of the memory blocks has plural strings STe1~STek, STo1~STok connected between bit lines BLe1~BLek, BLo1~BLok and a common source line CSL. That is, the strings ST1~ST2k are connected respectively to the bit lines BL1~BL2k and are connected in common with the common source line CSL. Each of the cell strings, e.g. STe1 includes a source select transistor SST, memory cells C0e1~Cne1, and a drain select transistor DST, wherein a source of the source select transistor SST is connected to the common source line CSL, and a drain of the drain select transistor DST is connected to the bit line BLe1. The memory cells, e.g. C0e1~Cne1 are connected in series between the source select transistor SST and the drain select transistor DST. A gate of the source select transistor SST is connected to a source select line SSL, gates of the memory cells C0e1~Cne1 are connected respectively to word lines WL0~WLn, and a gate of the drain select transistor DST is connected to a drain select line DSL.

Memory cells included in a memory block in the NAND flash memory device may be divided into a physical page or a logical page. For example, memory cells C0e1~C0ek, C0o1~C0ok connected to one word line (e.g. WL0), form one physical page PAGE0. Memory cells C0e1~C0ek in an even-numbered order connected to one word line (e.g. WL0) may form one even physical page, and memory cells C0o1~C0ok in an odd-numbered order may form one odd physical page. The page (even page and odd page) is a standard unit in the program operation or the read operation.

The control circuit 120 outputs an internal command signal CMDi for performing the program operation, the read operation or the test operation in response to a command signal CMD received from an external source through the input/output circuit 170, and outputs PB control signals PB_SIG- NALS for controlling page buffers PB1~PBk included in the page buffer group 150 depending upon the type of operation. Operation of the control circuit 120 for controlling the page buffer group 150 will be described in more detail below. The control circuit 120 outputs a row address signal RADD and a column address signal CADD in response to an address signal ADD received from an external source through the input/output circuit 170. The control circuit 120 may include a counter 122 and registers 124. The counter 122 may count the number of program pulses applied to a word line until the program operation is passed (by performing a program operation and a verify operation in the test operation) and store the counted result in the registers 124. The number of program pulses applied to the word line, until the program operation is passed after the test operation is performed, may be stored in a ROM, and so information concerning the number of program pulses (counted result) stored in the registers 124 may not be erased even when power is removed from the semiconductor memory device. In another embodiment, the register 124 may have non-volatile memory cells. The control circuit 120 in FIG. 1 includes both the counter 122 and the registers 124; however, the control circuit 120 may control operation of the counter 122 and the registers 124 if the counter 122 and the registers 124 are located outside of the control circuit 120.

The voltage supplement circuit 130, 140 provides operating voltages (e.g. Vpgm, Vread, Vpass), needed for program operation, read operation and test operation of the memory cells, to local lines including the drain select line DSL, the word lines WL0, . . . , WLn and the source select line SSL in response to the internal command signal CMDi of the control circuit 120. The voltage supplement circuit includes a voltage generation circuit 130 and a row decoder 140.

The voltage generation circuit 130 outputs operating voltages (e.g. Vpgm, Vread, Vpass), needed for program operation, read operation and test operation, to global lines in response to the internal command signal CMDi of the control circuit 120. For example, the voltage generation circuit 130 outputs the program voltage Vpgm applied to memory cells of the selected page, and a pass voltage Vpass applied to memory cells not selected, to the global lines when the program operation is performed. The voltage generation circuit 130 outputs the read voltage Vread applied to the memory cells of the selected page and the pass voltage Vpass applied to the memory cells not selected to the global lines when the read operation is performed. The voltage generation circuit 130 may output the program voltage Vpgm and the pass voltage Vpass in a test operation related to storage of data as in the program operation, and may output the read voltage Vread and the pass voltage Vpass in a test operation related to reading of data as in the read operation.

The row decoder 140 connects the global lines to the local lines DSL, WL0~WLn, SSL so that the operating voltages supplied to the global lines from the voltage generation circuit 130 are delivered to the local lines DSL, WL0~WLn, SSL of selected memory block 110MB in the memory array 110 in response to the row address signals RADD of the control circuit 120. As a result, the program voltage Vpgm or the read voltage Vread is applied to a local word line (e.g. WL0) connected to a selected memory cell (e.g. C0e1) from the voltage generation circuit 130 through a global word line. The pass voltage Vpass is provided to local word lines, e.g. WL1~WLn, connected to memory cells C1e1~Cne1 that are not selected, from the voltage generation circuit 130 through global word lines. An erase voltage Vera may be applied to all of the memory cells in the memory block in an erase operation. Accordingly, data is stored in the selected memory cell C0e1 according to the program voltage Vpgm, or data stored in the selected cell C0e1 is read by the read voltage Vread.

The page buffer group 150 includes page buffers PB1~PBk connected to the memory array 110 through the bit lines BLe1~BLek, BLo1~BLok. The page buffers PB1~PBk in the page buffer group 150 selectively precharge the bit lines BLe1~BLek or BLo1~BLok according to data inputted for storing in the memory cells C0e1~C0ek or C0o1~C0ok in response to the PB control signal PB_SIGNALS of the control circuit 120. In the alternative, the page buffers PB1~PBk may sense the voltage of the bit lines BLe1~BLek or BLo1~BLok to read data from the memory cells C0e1~C0ek or C0o1~C0ok.

In the event that program data, (e.g. data '0') is applied to the page buffer PB1 for storing in the memory cell C0e1, the page buffer PB1 applies a program allowable voltage (e.g. ground voltage) to the bit line BLe1 of the memory cell C0e1 for storing the program data in the program operation. As a result, threshold voltage of the memory cell C0e1 increases by the program voltage Vpgm applied to the word line WL0 and the program allowable voltage applied to the bit line BLe1 in the program operation. If erase data (e.g. data '1') is applied to the page buffer PB1 for storing in the memory cell C0e1, the page buffer PB1 applies a program inhibit voltage (e.g. supply voltage) to the bit line BLe1 of the memory cell C0e1 for storing the erase data in the program operation. As a result, the threshold voltage of the memory cell C0e1 does not increase by the program inhibit voltage applied to the bit line BLe1 even though the program voltage Vpgm is provided to the word line WL0 in the program operation. Since the threshold voltages of the memory cells are different according to the applied voltage, different data may be stored in the memory cells.

In the read operation, the page buffer group 150 precharges each of the selected bit line, and discharges all of the bit lines BLo1~BLok not selected. When the read voltage Vread is applied from the voltage supplement circuit 130, 140 to the selected word line WL0, the bit lines of the memory cells intended to store program data maintain their precharg state, and the bit lines of the memory cells intended to store erase data are discharged. The page buffer group 150 senses voltage change of the bit lines BLe1~BLek, and latches data of the memory cells corresponding to the sensed result.

The column select circuit 160 selects the page buffers PB1~PBk included in the page buffer group 150 in response to the column address signal CADD outputted from the control circuit 120. That is, the column select circuit 160 delivers, in sequence, data to be stored in the memory cells to the page buffers PB1~PBk in response to the column address signal CADD. Additionally, the column select circuit 160 selects the page buffers PB1~PBk in response to the column address signal CADD so that the data of the memory cells latched in the page buffers PB1~PBk is provided to an external device subsequent to a read operation.

The input/output circuit 170 delivers data to the column select circuit 160, responsive to the control circuit 120, to input the data received from an external source for storing in the memory cells, to the page buffer group 150 in the program operation. When the column select circuit 160 delivers the data provided from the input/output circuit 170 to the page buffers PB1~PBk in the page buffer group 150 as described above, the page buffers PB1~PBk latch the delivered data in an internal latch circuit. In a read operation, the input/output circuit 170 outputs data delivered from the page buffers PB1~PBk of the page buffer group 150 through the column select circuit 160 to an external device.

The pass/fail checking circuit 180 outputs a pass/fail signal PF_SIGNAL in response to comparison result signals PF[1]~PF[k] outputted from each of the page buffers PB1~PBk in a program verifying operation performed after the program operation is performed. Specifically, the threshold voltage of the memory cell is compared with a target voltage in the program verifying operation, and the compared result is latched in the internal latch circuit of the page buffers PB1~PBk. The comparison result signals PF[1]~PF[k] having the latched compared result are provided to the pass/fail checking circuit 180. The pass/fail checking circuit 180 outputs the pass/fail signal PF_SIGNAL, that indicates whether the program operation is finished, to the control circuit 120 in response to the comparison result signals PF[1]~PF[k]. The control circuit 120 detects whether a memory cell having a threshold voltage smaller than the target voltage of the memory cells for storing the program data has been found in response to the pass/fail signal PF_SIGNAL, and determines whether the program operation will be performed again in response to the detected result.

Figure 3:
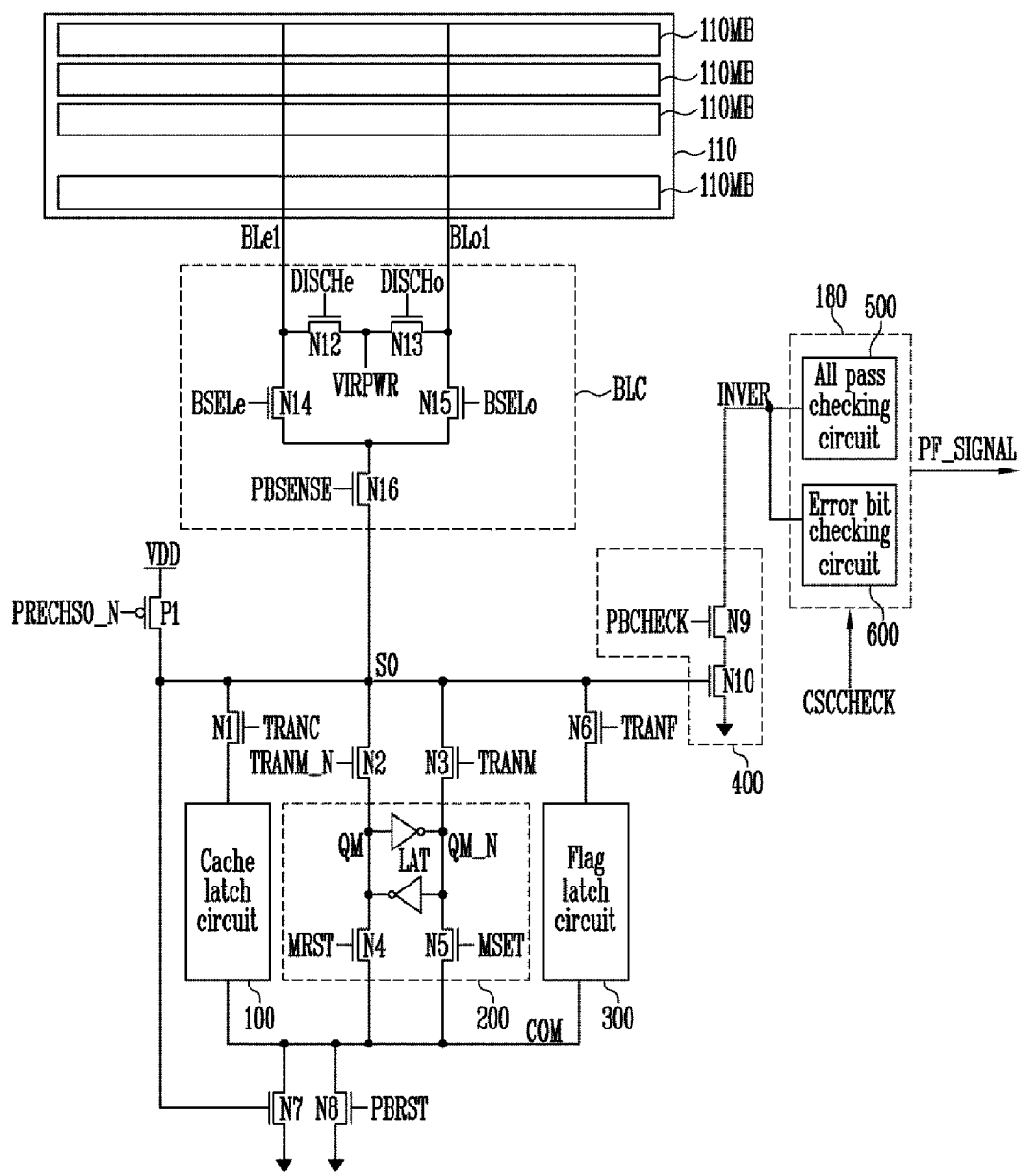
FIG. 3 illustrates circuitry of a page buffer of FIG. 1 in greater detail.

FIG. 3 is a view illustrating circuitry of a page buffer in FIG. 1.

In FIG. 3, the page buffer PB1 operates in response to the control circuit (120 in FIG. 1), and the control circuit may output signals PRECHSO_N, TRANC, TRANM, TRANF, MRST, MSET, PBRST, PBCHECK, PBSENSE, BLSe, BLSo, DISCHe, DISCHo described below.

The page buffer PB1 includes a bit line connection circuit BLC, a precharge circuit P1, a reset circuit N8, latch circuits 100, 200, 300, a verifying circuit 400, an all pass checking circuit 500 and an error bit checking circuit 600. The all pass checking circuit 500 and the error bit checking circuit 600 may be included in the pass/fail checking circuit (180 in FIG. 1).

Switching elements N14, N15 of the bit line connection circuit BLC select one of an even bit line BLe1 and an odd bit line BLo1 in response to bit line select signals BLSe, BLSo, and switching elements N12, N13 precharge a bit line not selected in the program operation in response to discharge signals DISCHe, DISCHo, or discharge a bit line not selected in the read operation. A switching element N16 connects the bit line selected by the switching elements N14, N15 to one of the latch circuits 100 to 300 in response to a connection signal PBSENSE. The latch circuits 100 to 300 are connected in parallel to the switching element N16, and a node between the switching node N16 and the latch circuits 100 to 300 is a sensing node SO.

The precharge circuit P1 prechareges the sensing node SO in response to a precharge signal PRECHSO_N.

The reset circuit N8 discharges by connecting a common node COM to a ground terminal in response to a reset signal PBRST.

The number of latch circuits 100 to 300 may be increased or decreased in accordance with circuit design, and is assumed to be three in the following description. A cache latch circuit 100 may temporarily store data provided from the column select circuit 160 and deliver the stored data to a main latch circuit 200, or temporarily store data read from the memory cell in the read operation and deliver the stored data to the column select circuit 160. The main latch circuit 200 may apply the program inhibit voltage or the program allowable voltage to the bit line according to the data delivered from the cache latch circuit 100 when the program operation is performed. In addition, the main latch circuit 200 may temporarily store data from the memory cell in response to a voltage of the bit line in the read operation, and deliver the stored data to the cache latch circuit 100. A flag latch circuit 300 may latch a comparison result value obtained by comparing the threshold voltage of the memory cell with the target voltage in the verify operation performed after the program operation is performed, and output a comparison result signal, corresponding to the comparison result value, to the pass/fail checking circuit (180 in FIG. 1). Operation of the flag latch circuit 300 may be performed by the main latch circuit 200.

The latch circuits include switching elements and a latch. Configuration and operation of the latch circuits will be described through the main latch circuit 200.

The main latch circuit 200 includes a latch LAT for latching data, a switching element N2 for connecting a first node QM of the latch LAT to the sensing node SO in response to a first transmission signal TRANM_N, a switching element N3 for connecting a second node QM_N of the latch LAT to the sensing node SO in response to a second transmission signal TRANM, switching elements N4, N5 connected to each of the first node QM and the second node QM_N, and operating in response to a set signal MSET and a reset signal MRST, and a switching element N7 connected between the switching elements N4, N5 and the ground terminal and operating according to potential of the sensing node SO. The switching elements N2, N3, N7 are located outside the latch circuit in FIG. 3, but the switching elements N2, N3, N7 may be included in the latch circuit as noted above.

Since signals having different waveforms are inputted to the latch circuits 100, 300, only one of the latch circuits 100, 300 may be activated, or the latch circuits 100, 300 may perform different functions, even though the latch circuits 100, 300 are implemented in the same fashion.

The verifying circuit 400 is connected between a verifying terminal INVER and a ground terminal, and forms current pass from the verifying terminal INVER to the ground terminal according to a page buffer checking circuit PBCHECK activated in a pass/fail checking operation and the potential of the sensing node SO. The verifying circuit 400 includes switching elements N9, N10 connected between the verifying terminal INVER and the ground terminal. The switching element N9 is turned on according to the page buffer checking circuit PBCHECK, and the switching element N10 is turned on in accordance with the potential of the sensing node SO. Accordingly, the current path is formed from the verifying terminal INVER to the ground terminal according to the potential of the sensing node SO in the pass/fail checking operation. One verifying circuit 400 is included in each of the page buffers.

The all pass checking circuit 500 detects whether threshold voltage of memory cells in a first page for which a program verify operation is performed is higher than a verifying voltage. The all pass checking circuit 500 is connected to the verifying terminal INVER of the verifying circuit 400 included in each of the page buffers. The all pass checking circuit 500 detects whether the threshold voltage of every memory cell is greater than the verifying voltage, depending upon whether the verifying terminal INVER is coupled to the ground terminal. This is determined by the potential of the sensing node SO as a result of the program verify operation.

If the threshold voltage of the memory cell increases to a voltage more than the verifying voltage, the potential of the sensing node SO is at a high level. When the page buffer checking signal PBCHECK is applied, the verifying terminal INVER is connected to the ground terminal, and so the verifying terminal INVER is discharged. Thus, if the memory cell has a threshold voltage smaller than the verifying voltage, the verifying terminal INVER remains in a floating state. The all pass checking circuit 500 may detects whether the threshold voltage of every memory cell is greater than the verifying voltage through the process described above, and outputs the pass or fail signal PASS/FAIL depending upon the detected result.

The error bit checking circuit 600 determines the number of memory cells (failed memory cells) having a threshold voltage smaller than the verifying voltage, i.e. the number of error bits determined by the verify operation. The error bit checking circuit 600 compares the measured amount of current passing through the current path of a failed memory cell in the selected page buffer group with a reference current, and determines the number of error bits in the corresponding page in accordance with the result of the comparison operation.

The error bit checking circuit 600 compares the measured amount of current passing through the current path of the failed memory cell in the selected page buffer group with a reference current corresponding to the maximum number of error-correctable bits capable of being processed by an error correcting code (ECC) circuit, and outputs the pass or fail signal PASS/FAIL in accordance with the result of the comparison. For example, the error bit checking circuit 600 outputs the fail signal FAIL when the measured amount of current is greater than the reference current, and outputs the pass signal PASS when the measured amount of current is smaller than the reference current.

The control circuit (120 in FIG. 1) compares the number of program loops performed, including a program verify operation conducted using first through third verifying voltages, with a first iteration number. The first iteration number may be the same as or smaller than the number of program loops stored in the test operation. The control circuit (120 in FIG. 1) outputs the page buffer checking signal PBCHECK, and an input signal (not shown) of the all pass checking circuit 500, when the number of program loops is more than the first iteration number, and outputs an input signal (not shown) of the error bit checking circuit 600 when the number of program loops is more than a second iteration number.

Figure 4:
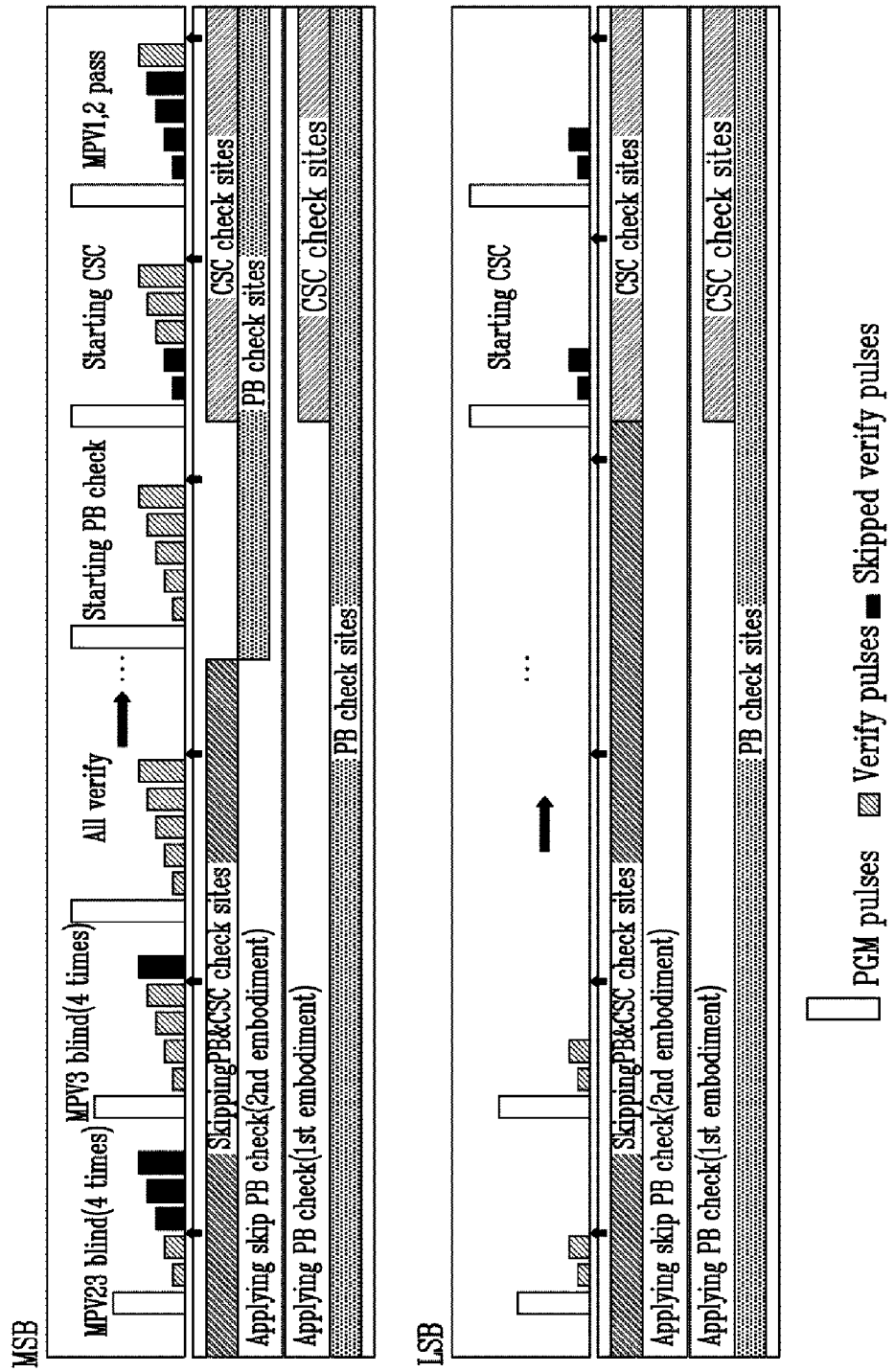
FIG. 4 is a stylized view of operation of the semiconductor memory device according to first and second embodiments of the present invention.

FIG. 4 is a view illustrating schematically operation of the semiconductor memory device according to a first embodiment and a second embodiment of the present invention.

FIG. 4 illustrates that operation of the semiconductor memory device in the first embodiment and the second embodiment of the present invention may be divided into an LSB data program operation and an MSB data program operation.

In the LSB data program operation according to the first embodiment, a program loop, including a program operation and a first verify operation, is performed repetitively. In particular, the program loop, where the program operation is performed by applying a program voltage to a word line connected to memory cells to be programmed, and the first verify operation is performed based on a first verifying voltage, is performed repetitively. FIG. 4 shows two verify pulses, but the verify operation is performed in conjunction with the second verify pulse.

The LSB data program operation detects whether the threshold voltage of every memory cell to be programmed in a corresponding page increases to a voltage more than the first verifying voltage after the verify operation is performed. In the event that the threshold voltage of every memory cell to be programmed in the page increases to a voltage more than the first verifying voltage, the program operation is finished because the program operation is passed.

In the event that a memory cell having a threshold voltage smaller than the first verifying voltage is detected, the LSB data program operation increases the programming voltage and repetitively performs the program loop using the increased programming voltage. The LSB data program operation performs an error bit checking operation after repetitively performing the program loop a preset number of iterations. The error bit checking operation detects the number of error bits in the corresponding page after the program operation and the verify operation are performed. The LSB data program operation may use a current sensing circuit CSC for the purpose of detecting the number of error bits. Even when a memory cell having a threshold voltage that has not increased to a voltage greater than the first verifying voltage is detected, the LSB data program operation may determine that the program operation is passed if the number of error bits falls within an allowable range of error-correctable bits that can be corrected by an error correcting code (ECC). The LSB data program operation of the first embodiment performs the all pass checking operation whenever the program loop including the program operation and the verify operation, is performed.

The MSB data program operation of the semiconductor memory device, according to the first embodiment, is similar to the LSB data program operation, except that first through third verifying voltages are applied to memory cells in corresponding pages when the verify operation is performed. FIG. 4 shows five verify pulses. In operation, a first verify operation is performed after two verify pulses are applied, a second verify operation is performed after two more verify pulses are provided, then a third verify operation is performed after the final verify pulse is applied.

The probability that the threshold voltages of any memory cells have increased to a voltage more than the second verifying voltage or the third verifying voltage is low in the initial four program loops. Consequently, the program loop, including a program operation and a verify operation based on the first verifying voltage, is repetitively performed. In next four program loops, the program loop, including a program operation and a verify operation based on the first verifying voltage and the second verifying voltage, is repetitively performed. In the subsequent operation, the program loop, including a program operation and a verify operation based on first through third verifying voltages, is repetitively performed.

The MSB data program operation detects whether the threshold voltage of every memory cell to be programmed in a corresponding page increases to a voltage more than the first through third verifying voltages, respectively. When the threshold voltage of every memory cell to be programmed increases to a voltage more than the first through third verifying voltages, a corresponding verify operation is not performed, because the corresponding program operation is passed.

If a memory cell having a threshold voltage smaller than the verifying voltage utilized by a particular verify operation is detected, the program loop is repetitively performed with increasing programming voltage. An error bit checking operation is performed after the program loop is repetitively performed a predetermined number of iterations. The MSB data program operation also performs the all pass checking operation whenever the program loop, including the program operation and the verify operation, is performed, just as in LSB data program operation.

Operation of the semiconductor memory device according to the second embodiment is similar to operation according to the first embodiment, except that it does not perform an all pass checking operation whenever a program loop, including a program operation and a verify operation, is performed. The number of program pulses applied to a word line are counted, until the threshold voltage of every memory cell in the corresponding page is programmed to have a voltage greater than a first verifying voltage by performing the program loop in the test operation of the semiconductor memory device, and stores the counted result in a register. The all pass checking operation is not performed until the number of program pulses reaches the counted result, then the all pass checking operation is performed. The number of program pulses is counted when the test operation is performed in accordance with the above description. However, the all pass checking operation may be performed after it reaches the program pulse corresponding to the counted result, when a program loop is performed on next pages after the number of program pulses is counted by performing a program loop for a first page.

An MSB data program operation, for operation in accordance with the second embodiment, does not perform a third checking operation for detecting whether the threshold voltage of every memory cell has increased to a voltage more than a third verifying voltage, of the all pass checking operation. In other words, the MSB data program operation performs a first checking operation and a second checking operation when the all pass checking operation is performed, after the verify operation is performed, on the basis of the program operation and the first through third verifying voltages, and then performs the error bit checking operation without performing the third checking operation. The first checking operation detects whether the threshold voltage of every memory cell has increased to a voltage more than the first verifying voltage, and the second checking operation detects whether the threshold voltage of every memory cell has increased to a voltage more than the second verifying voltage.

After the verifying operation based on the second verifying voltage is passed (because the threshold voltage of every memory cell is greater than the second verifying voltage), only memory cells to be programmed to a voltage greater than the third verifying voltage remain. Since the third checking operation is overlapped with the error bit checking operation, it does not need to be performed. That is, since error bits may be corrected when the number of memory cells having a threshold voltage smaller than the third verifying voltage (i.e. the number of error bits), is smaller than the number of maximum error-correctable bits, the program operation need not be performed any further.

In one embodiment of the present invention, the error bit checking operation may begin at a time when the number of program pulses provided in the program operation is the same as of the number of program pulses applied until the second verify operation is passed. In other words, operation in the second embodiment counts the number of program pulses applied until the second verify operation is passed in the test operation, and stores the counted result, then performs the error bit checking operation from the time when the number of program pulses provided to the word line in the program operation is the same as the stored counted result.

In brief, operation of the semiconductor memory device in the second embodiment counts the number of program pulses provided until the threshold voltage of the memory cells increases to a voltage more than the first verifying voltage in the test operation, and stores the counted result. Then, the all pass checking operation is performed from the time at which the number of program pulses reaches the stored counted result in the program operation, thereby preventing performance of the unnecessary all pass checking operation. Furthermore, since the error bit checking operation is performed without performing the third checking operation after the second checking operation is performed, a shorter time is required for programming.

Figure 5:
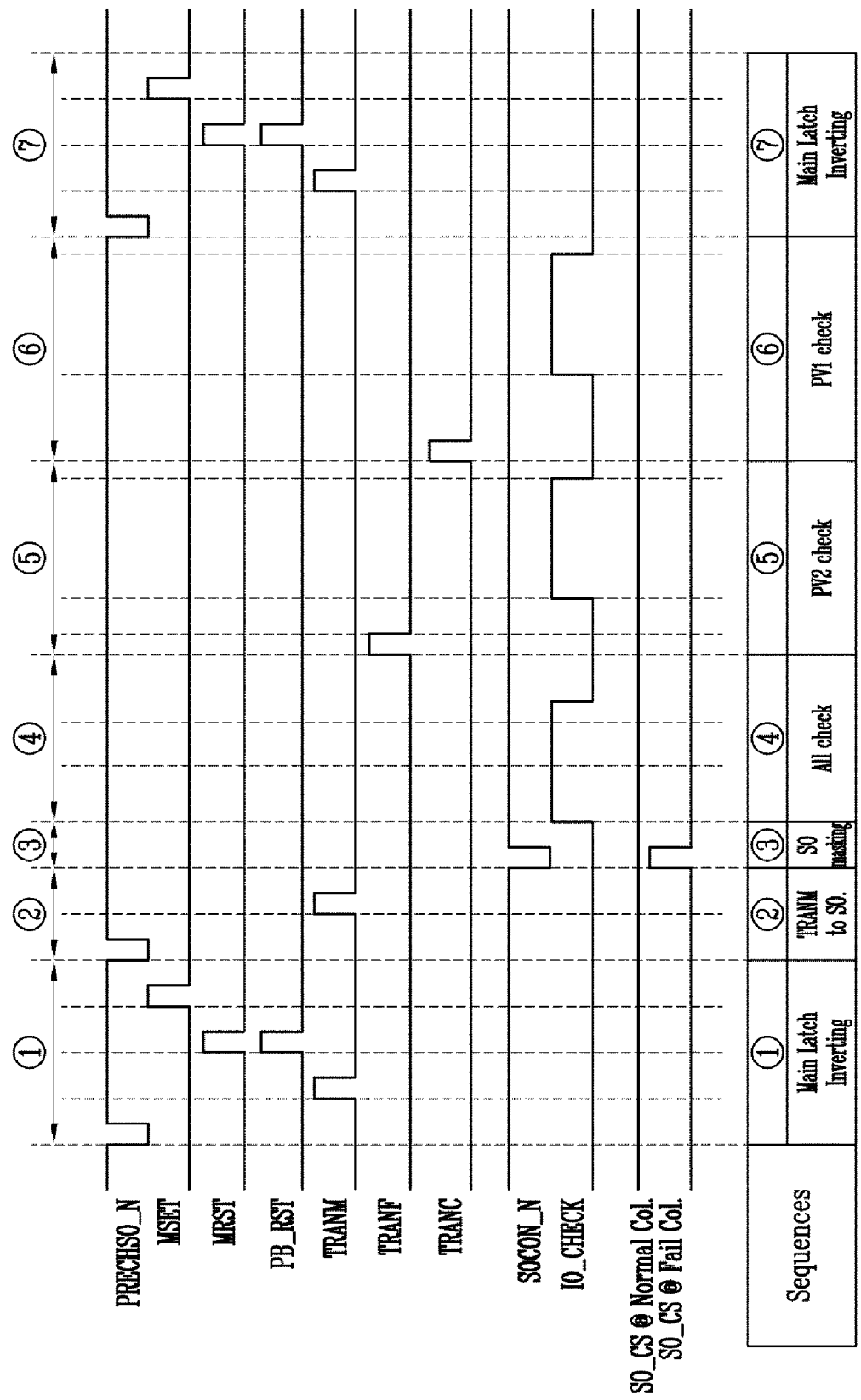
FIG. 5 is a timing diagram illustrating an MSB data verifying operation of a semiconductor memory device according to a first embodiment of the present invention.
Figure 6:
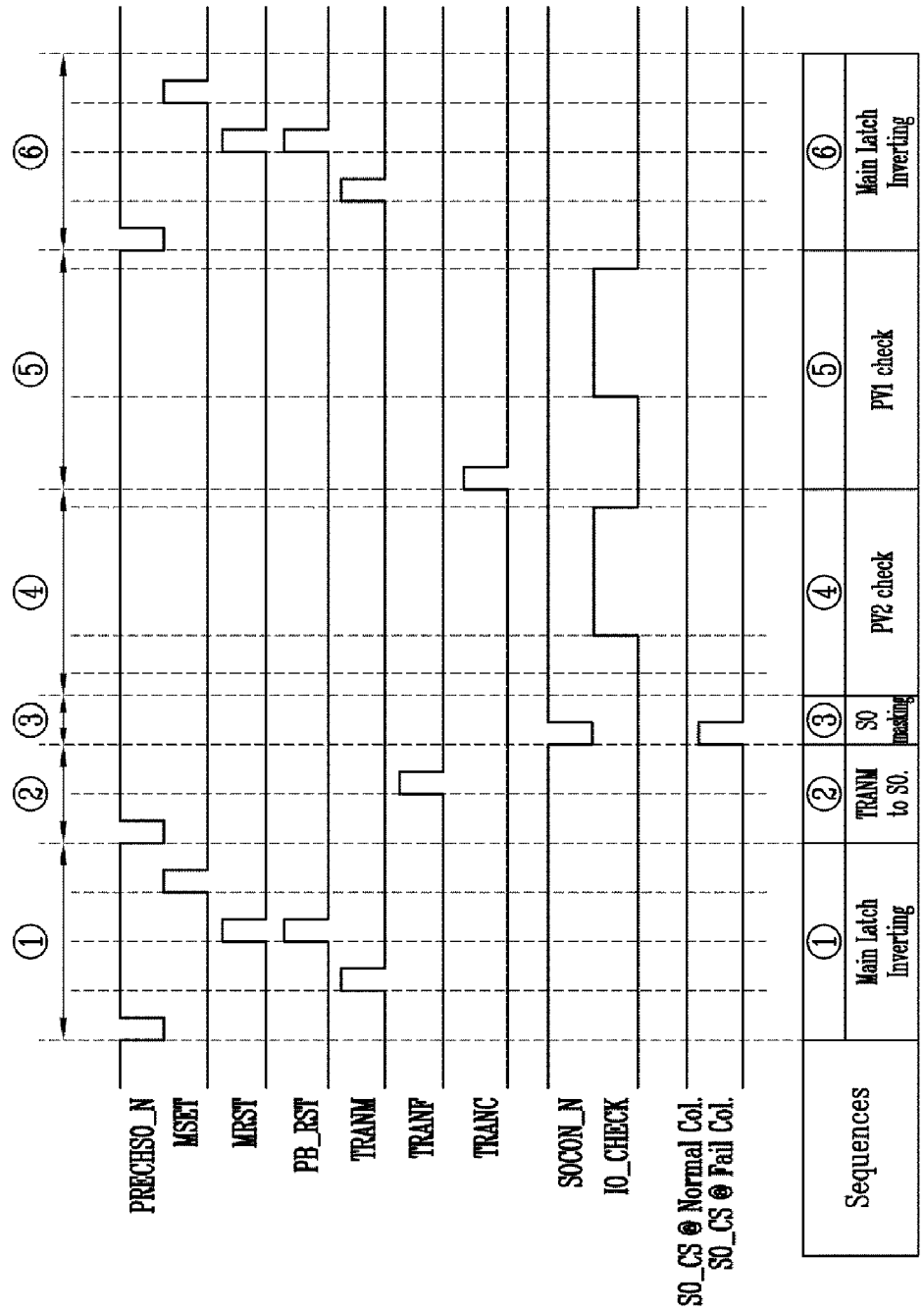
FIG. 6 is a timing diagram illustrating an MSB data verifying operation of a semiconductor memory device according to a second embodiment of the present invention.

FIG. 5 is a timing diagram illustrating an MSB data verifying operation of operation of a semiconductor memory device according to a first exemplary embodiment of the present invention, and FIG. 6 is a timing diagram illustrating an MSB data verifying operation of operation of a semiconductor memory device according to a second embodiment of the present invention.

Hereinafter, an MSB page buffer checking operation of the MSB data verifying operation will be described in detail.

In FIG. 5, each of the page buffers in the page buffer group verifies program state of memory cells in a page through bit lines BLe1 to Blok connected thereto, and stores the verified result. Particularly, the MSB data verifying operation precharges the bit lines to a high level in the program verifying operation, and then applies a verifying voltage to a word line connected in common to the memory cells. As a result, the potential of the bit line is maintained at a high level or is discharged to a low level according to the program state of the memory cells. Here, program data to be programmed in the memory cells is stored in the latch of each of the page buffers. The MSB data verifying operation compares the program data with the potential of the bit line, and stores verifying data in the latch according to the compared result. The verifying data is "1" (corresponding to the potential of the second node QM_N having a high level) when it is determined that the program operation is passed because the program data corresponds to the potential of the bit line. The verifying data is "0" (corresponding to the potential of the second node QM_N having a low level) when it is determined that the program operation has failed because the program data does not correspond to the potential of the bit line.

The MSB data verifying operation precharges the sensing node SO to a high level using the precharge circuit, and then connects the first node QM to the sensing node SO by applying the first transmission signal TRANM_N at a high level. To connect the second node QM_N to the sensing node SO by providing the second transmission signal TRANM having a high level in FIG. 5, the MSB data verifying operation inverts the data stored in the main latch circuit 200 before connecting the second node QM_N to the sensing node SO by providing the second transmission signal having a high level. Accordingly, the effect of the above methods may be the same.

When the MSB data verifying operation masks the sensing node SO, the potential of the sensing node SO is controlled by the verifying data latched in the latch circuit 200. That is, the sensing node SO of the page buffer, corresponding to the passed memory cell, is discharged to a low level, and the sensing node SO of the page buffer corresponding to a failed memory cell is maintained at a high level. Accordingly, the MSB data verifying operation may verify through the page buffer checking operation whether or not every memory cell in the corresponding page is passed. In particular, the MSB data verifying operation may verify through a first checking operation to a third checking operation whether or not every memory cell in the corresponding page is programmed to a voltage more than the first through third verifying voltages. The page buffer checking operation is performed in an order of the third checking operation, the second checking operation, and the first checking operation in FIG. 5. If the third checking operation is performed first, the MSB data verifying operation may detect memory cells programmed to a voltage more than the third verifying voltage in the event that the memory cells are programmed quickly. However, the order of the checking operations is not limited to the order mentioned above.

The events depicted in FIG. 6 are similar to those in FIG. 5. However, the MSB page buffer checking operation in accordance with the second embodiment of the present invention directly performs the error bit checking operation without performing the third checking operation for verifying whether the threshold voltage of the memory cells in the corresponding page increases to a voltage greater than the third verifying voltage. As shown in FIG. 5, the MSB data verifying operation performs the second checking operation without performing the third checking operation, after the sensing node masking operation is performed. Accordingly, time required for the programming operation is reduced.

Figure 7:
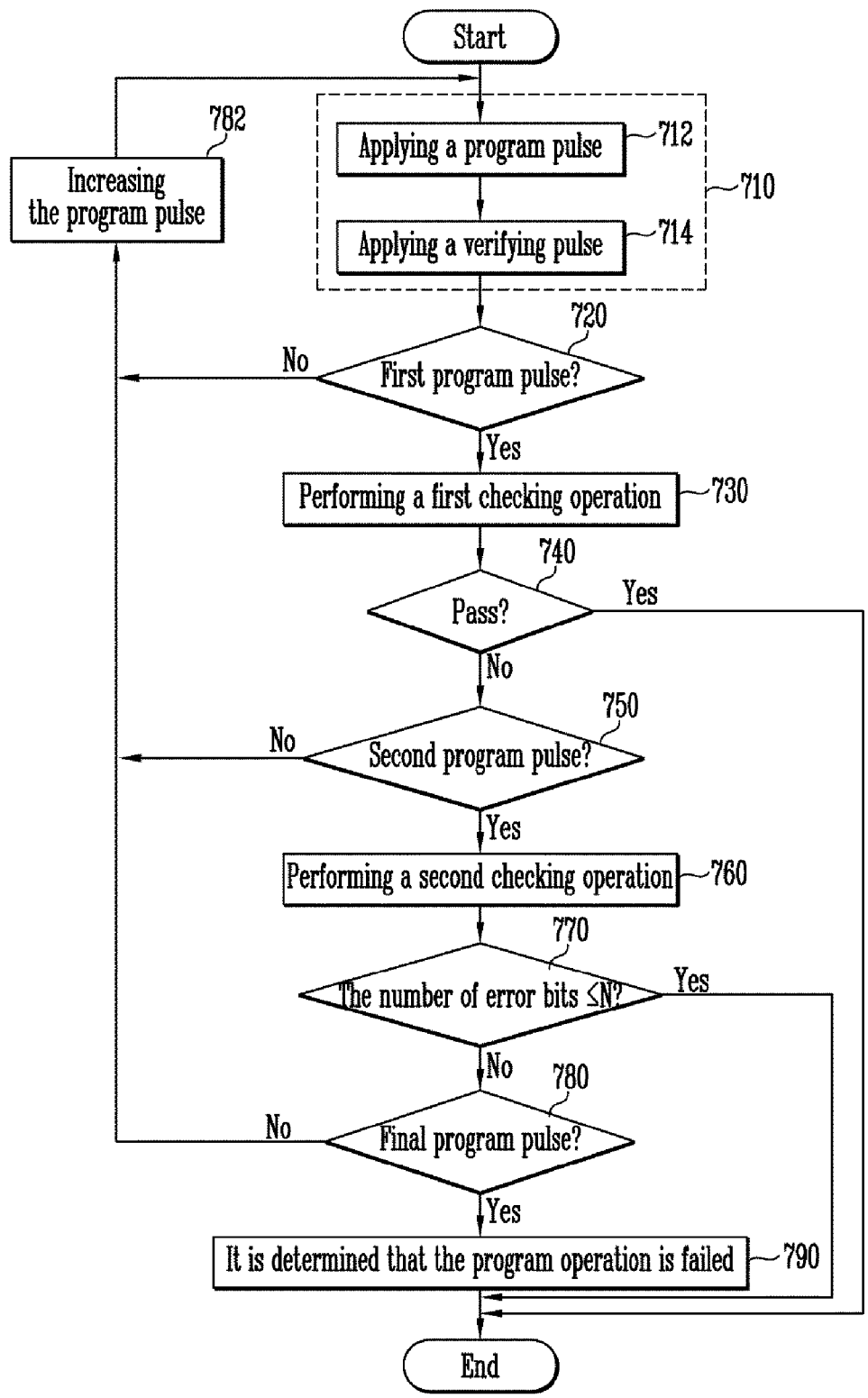
FIG. 7 is a flowchart illustrating an LSB data verifying operation of a semiconductor memory device according to a second embodiment of the present invention.

FIG. 7 is a flowchart illustrating an LSB data verifying operation of operation of a second memory device according to a second embodiment of the present invention.

In step S710, as illustrated in FIG. 7, the LSB data verify operation performs a program loop. The program loop includes a program operation and a first verify operation. The first verify operation is performed in step S714 after a program pulse is applied in step S712. The LSB data verify operation may perform the first verify operation on the basis of a first verifying voltage, since it is a verifying operation of an LSB data.

In step S720, the LSB data verify operation detects whether the program pulse is a first program pulse for the all pass checking operation. If the program pulse is not the first program pulse, the LSB data verify operation increases the program pulse in step 782 and performs step S710 again. As illustrated in FIG. 4, the LSB data verify operation counts the number of program pulses applied until memory cells programmed to a voltage more than the first verifying voltage are detected in the test operation, then stores the counted result in the register, and performs the all pass checking operation beginning when the number of program pulses corresponds to the stored counted result in the program operation. The LSB data verify operation performs the first checking operation when the number of program pulses applied corresponds to the counted result stored in the register in step S730, then verifies whether programming of every memory cell in the corresponding page is passed in step S740. If programming is passed, the LSB data verify operation is finished.

In case the programming operation is not passed, the LSB data verify operation determines whether the program pulse currently being applied corresponds to a second program pulse for performing the error bit checking operation in step S750. If the program pulse does not correspond to the second program pulse, the LSB data verifying operation increases the program pulse in step 782 and then performs step S710 again. The LSB data verify operation may also count the number of second program pulses for performing the error bit checking operation, and store the counted result in a fashion similar to storing the number of first program pulses for performing the all pass checking operation in the test operation. However since the above operation is more significant in an MSB checking operation than in the LSB checking operation, it will be described in detail subsequently.

If the program pulse currently being applied corresponds to the second program pulse for performing the error bit checking operation, the LSB data verify operation verifies whether the number of error bits is less than a number N by which error bits are correctable by an error-correcting code ECC in step S770 by performing the second checking operation in step S760. If the number of error bits is less than the number N, the program operation is finished. If the number of the error bits is greater than N, the LSB data verify operation detects whether the program pulse currently being applied is the final program pulse in step S780. If the program pulse currently being applied is not the final program pulse, the LSB data verifying operation increases the program pulse in step S782 and then performs the program loop again in step S710. If the program pulse currently being applied is the final program pulse program operation has failed in step S790, and the LSB data verifying operation is finished.

Figure 8:
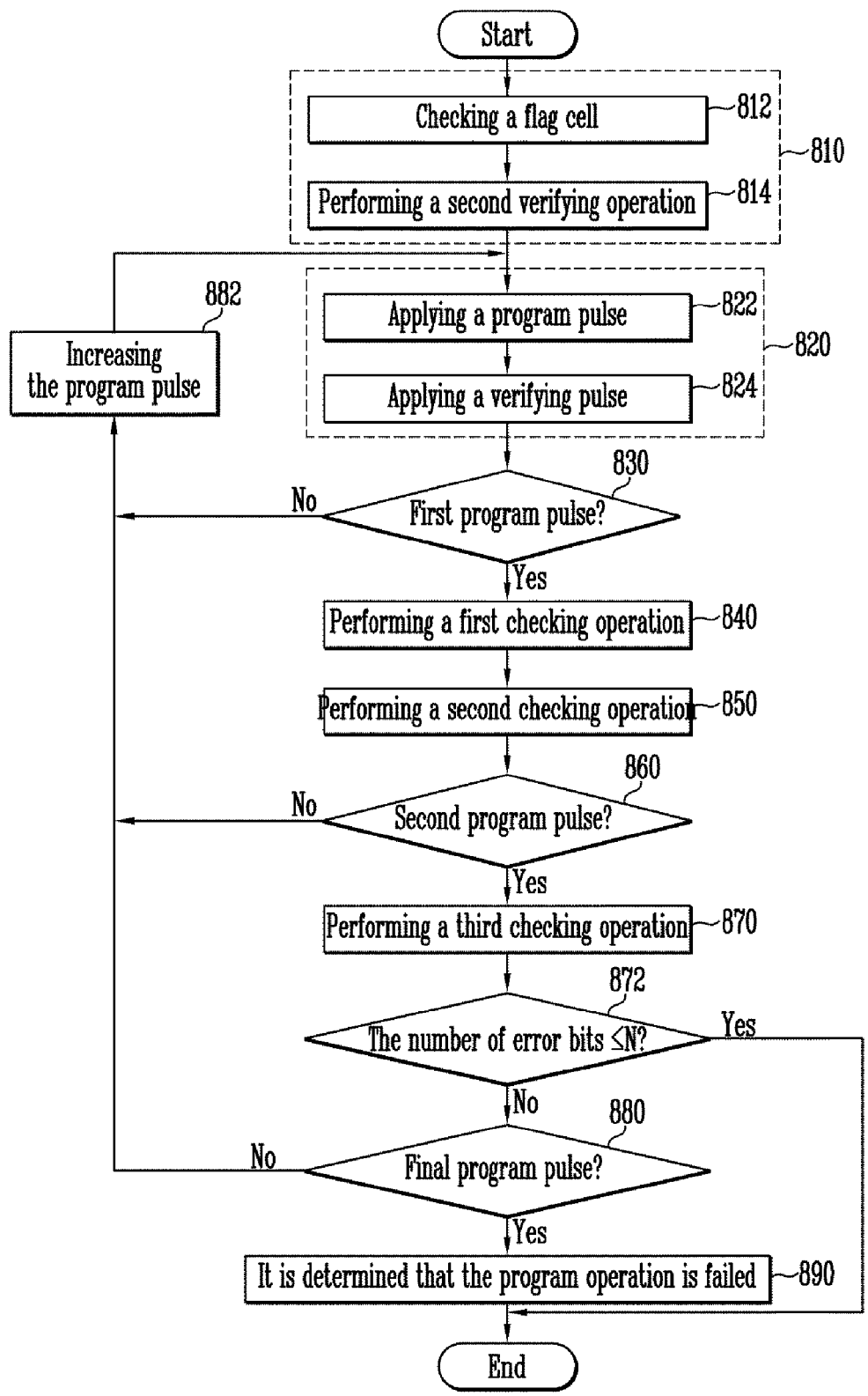
FIG. 8 is a flowchart illustrating an MSB data verifying operation of a semiconductor memory device according to a second embodiment of the present invention.

FIG. 8 is a flowchart illustrating an MSB data verifying operation of operation of a semiconductor memory device according to a second embodiment of the present invention.

The MSB data verifying operation detects whether a program operation is an MSB program operation in step S810 of FIG. 8. The MSB data verify operation checks a flag cell in step S812, and performs a verify operation on the basis of a second verifying voltage in step S814.

If the program operation is the MSB program operation, the MSB data verify operation performs a first program loop in step S820. The first program loop includes a program operation and a verify operation based on first through third verifying voltages. That is, the MSB data verify operation performs the program operation by applying a program voltage to a word line connected to memory cells in a page to be programmed in step S822, and performs the verify operation by applying a verifying voltage in step S824. Since the MSB data verify operation is a verify operation of MSB data, it may perform the verify operation in sequence utilizing the first through third verifying voltages.

In step S830, the MSB data verify operation verifies that the program pulse is a first program pulse for performing the all pass checking operation. If the program pulse is not a first program pulse, the MSB data verify operation increases the program pulse in step S882 and then performs step S820 again. If the program pulse currently being applied corresponds to the first program pulse stored in the register, the third checking operation is skipped. The MSB data verify operation performs only the first checking operation and the second checking operation in steps S840 and S850. That is, the MSB data verify operation verifies whether the threshold voltage of every memory cell has increased to a voltage greater than the first verifying voltage by performing the first checking operation, and verifies whether the threshold voltage of every memory cell has increased to a voltage greater than the second verifying voltage by performing the second checking operation. If the threshold voltage of every memory cell has increased to a voltage greater than the first verifying voltage in step S840, the verify operation based on the first verifying voltage is not performed in following program loops. If the threshold voltage of every memory cell has increased to a voltage greater than the second verifying voltage in step S850, the verify operation based on the second verifying voltage need not be performed in following program loops.

In step S860, the MSB data verify operation determines whether the program pulse currently being applied corresponds to a second program pulse for performing the error bit checking operation. The MSB data verify operation counts the number of program pulses applied until the threshold voltage of every memory cell is greater than the second verifying voltage by performing the program operation in the test operation, then stores the counted result in the register, and may perform the error bit checking operation when the number of program pulses corresponds to the stored counted result in the program operation.

The MSB data verify operation performs the third checking operation when the program pulse corresponds to the second program pulse for performing the error bit checking operation in step S870, and verifies whether the number of error bits is less than a number N of error bits correctable by the error-correcting code ECC in step S872. The program operation is finished if the number of error bits is less than N.

If the number of error bits is greater than N, the MSB data verify operation determines whether the program pulse currently being applied is the final program pulse in step S880. If the program pulse currently being applied is not the final program pulse, the MSB data verify operation increases the program pulse in step S882 and then performs the program loop again in step S820. If the program pulse currently being applied is the final program pulse, it is determined that the program operation has failed in step S890, and the MSB data verify operation is finished.

Figure 9:
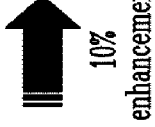
FIG. 9 includes tables illustrating time needed when operation of the semiconductor memory device is performed according to first and second embodiments of the present invention.

FIG. 9 includes tables illustrating time needed when operation of the semiconductor memory device is performed according to first and second embodiments of the present invention.

If a time needed for performing one LSB checking operation is 5 µs and a time required for performing one MSB checking operation is 11 µs, a time tPROG needed for total program operation can be reduced from 1638 µs to 1482 µs. A time tPROG needed for the program operation corresponds to the average of the time needed for an LSB program operation of an even page, an LSB program operation of an odd page, an MSB program operation of the even page, and an MSB program operation of the odd page.

The all pass checking operation is performed starting from the time at which the program operation corresponding to the first verifying voltage PV1 is passed. However, since the third checking operation is not performed, approximately 3 µs can be deducted. When the number of program pulses applied when the second and third verify operation PV23 and the third verify operation PV3 are performed is 12, 36 µs may be deducted. Six pulses as a blind pulse are applied in the first verifying operation PV1 and the first and the second verifying operation PV12, the all pass checking operation is not performed until the first through third verifying operations PV123 are performed, and only the error bit checking operation is performed without performing the third checking operation from a time point which only the third verifying operation PV3 should be performed because the second verifying operation PV2 is passed. Accordingly, performance in programming operation may be further enhanced.

While certain embodiments have been described above, it will be understood by those skilled in the art that the embodiments described are by way of example only. Accordingly, the semiconductor memory device and methods of operation described herein should not be limited based on the described embodiments. Rather, the semiconductor memory device and methods of operation described herein should only be limited in light of the claims that follow, when taken in conjunction with the above description and accompanying drawings.

Embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A method of operating a semiconductor memory device, the method comprising:
performing a first program loop including a first program operation and a first verify operation on memory cells in a first page;
performing a first checking operation for verifying whether threshold voltage of the memory cells in the first page is greater than a target voltage when the number of first program loops exceeds a first iteration number; and
performing a second checking operation for verifying the number of memory cells having a threshold voltage lower than the target voltage in the event that the first checking operation detects any memory cells having a threshold voltage lower than the target voltage.

2. The method of claim 1, wherein the first iteration number is less than the number of first program loops performed until the threshold voltage of the memory cells is greater than the target voltage in a test operation.

3. The method of claim 1, wherein the second checking operation is performed when the number of first program loops performed is more than a second iteration number greater than the first iteration number.

4. The method of claim 1, further comprising:
finishing the first program loop and performing a second program loop including a second program operation and a second verify operation on memory cells in a second page when the number of memory cells having a threshold voltage less than the target voltage is less than the maximum number of error-correctable bits.

5. The method of claim 1, further comprising:
performing the first program loop with increasing program voltage when the number of memory cells having a threshold voltage less than the target voltage exceeds the maximum number of error-correctable bits.

6. The method of claim 1, further comprising:
finishing the first program loop and performing a second program loop including a second program operation and a second verify operation on memory cells in a second page when the threshold voltage of every memory cell is greater than the target voltage according to the first checking operation.

7. A method of operating a semiconductor memory device, the method comprising:
performing a first program loop including a first program operation and first through third verify operations on memory cells in a first page;
performing a first checking operation for verifying whether threshold voltage of first memory cells among the memory cells is greater than a first verifying voltage as a target voltage, and a second checking operation for verifying whether threshold voltage of second memory cells among the memory cells is greater than a second verifying voltage as a target voltage, when the number of first program loops exceeds a first iteration number; and
performing a third checking operation for verifying the number of memory cells having a threshold voltage less than a corresponding target voltage of the first memory cells, the second memory cells and third memory cells corresponding to a third verifying voltage as a target voltage when the number of first program loops exceeds a second iteration number.

8. The method of claim 7, wherein the first iteration number is the number of first program loops performed until the threshold voltage of the memory cells increases to a voltage greater than the first verifying voltage in a test operation.

9. The method of claim 7, wherein the second iteration number is the number of first program loops performed until the threshold voltage of the memory cells increases to a voltage greater than the second verifying voltage in a test operation.

10. The method of claim 7, further comprising:
finishing the first program loop and performing a second program loop including a second program operation and a second verify operation on memory cells in a second page when the number of memory cells having a threshold voltage lower than the target voltage is less than the maximum number of error-correctable bits.

11. The method of claim 7, further comprising:
performing the first program loop with increasing program voltage when the number of memory cells having a threshold voltage less than the target voltage exceeds the maximum number of error-correctable bits.

12. The method of claim 7, further comprising:
performing a third program loop including a first program operation and a verify operation based on the second and the third verifying voltages when the threshold voltage of every memory cell is greater than the first verifying voltage according to the first checking operation.

13. The method of claim 7, further comprising:
performing a fourth program loop including a first program operation and a verify operation based on the third verifying voltage when the threshold voltage of every second memory cell is greater than the second verifying voltage according to the second checking operation.

14. A method of operating a semiconductor memory device, the method comprising:
performing a first program operation and a first verify operation based on first through seventh verifying voltages on memory cells in a first page;
performing first to sixth checking operations for verifying whether threshold voltage of the first to the sixth memory cells of the memory cells is greater than the first to the sixth verifying voltage as target voltages when the number of first program loops exceeds a first iteration number; and
performing a seventh checking operation for verifying the number of memory cells having a threshold voltage lower than a corresponding target voltage of the first to the sixth memory cells and seventh memory cells corresponding to a seventh verifying voltage as a target voltage when the number of first program loops exceeds a second iteration number.

15. The method of claim 14, wherein the first iteration number is the number of first program loops performed until the threshold voltage of the memory cells is greater than the first verifying voltage in a test operation.

16. The method of claim 14, wherein the second iteration number is the number of first program loops performed until the threshold voltage of the memory cells is greater than the sixth verifying voltage in the test operation.

17. The method of claim 14, further comprising:
finishing the first program loop and performing a second program loop including a second program operation and a second verify operation on memory cells in a second page when the number of memory cells having a threshold voltage less than the target voltage is less than the maximum number of error-correctable bits.

18. The method of claim 14, further comprising:
performing the first program loop with increasing program voltage when the number of memory cells having a threshold voltage less than the target voltage exceeds the maximum number of error-correctable bits.

19. A semiconductor memory device comprising:
a memory block including a plurality of memory cells;
a peripheral circuit configured to perform a first program loop including a first program operation and a first verify operation on memory cells in a first page of the memory cells; and
a control circuit configured to control the peripheral circuit for performing a first checking operation for verifying whether threshold voltage of the memory cells in the first page is greater than a target voltage when the number of first program loops exceeds a first iteration number, and performing a second checking operation for verifying the number of memory cells having a threshold voltage less than the target voltage in the event that the first checking operation detects any memory cells having a threshold voltage less than the target voltage.

20. The semiconductor memory device of claim 19, wherein the control circuit controls the peripheral circuit to perform the first checking operation when the number of first program loops exceeds the number of first program loops performed until the threshold voltage increases to a voltage greater than the target voltage in a test operation.

21. The semiconductor memory device of claim 19, wherein the control circuit controls the peripheral circuit to perform the second checking operation when the number of first program loops exceeds a second iteration number greater than the first iteration number.

22. The semiconductor memory device of claim 19, wherein the control circuit controls the peripheral circuit to finish the first program loop and perform a second program loop including a second program operation and a second verify operation on memory cells in a second page when the number of memory cells having threshold voltage less than the target voltage is less than the maximum number of error-correctable bits.

23. The semiconductor memory device of claim 19, wherein the control circuit controls the peripheral circuit to perform the first program loop with increasing program voltage when the number of memory cells having a threshold voltage lower than the target voltage exceeds the maximum number of error-correctable bits.

24. The semiconductor memory device of claim 19, wherein the control circuit controls the peripheral circuit to finish the first program loop and perform a second program loop including a second program operation and a second verify operation on memory cells in a second page when the threshold voltage of every memory cell is greater than the target voltage according to the first checking operation.

25. A semiconductor memory device comprising:
a memory block configured to include memory cells;
a peripheral circuit configured to perform a first program loop including a first program operation and a first verify operation based on first through third verifying voltages on memory cells in a first page of the memory cells; and
a control circuit configured to control the peripheral circuit to perform a first checking operation for verifying whether the threshold voltage of first memory cells among the memory cells is greater than the first verifying voltage as corresponding target voltage, perform a second checking operation for verifying whether the threshold voltage of second memory cells among the memory cells is greater than the second verifying voltage as corresponding target voltage when the number of first program loops exceeds a first iteration number, and perform a third checking operation for verifying the number of memory cells having a threshold voltage less than the third verifying voltage as corresponding target voltage of the first memory cells, the second memory cells and third memory cells when the number of first program loops exceeds a second iteration number.

26. The semiconductor memory device of claim 25, wherein the first iteration number is the number of first program loops performed until the threshold voltage of the memory cells increases to a voltage greater than the first verifying voltage in a test operation.

27. The semiconductor memory device of claim 25, wherein the second iteration number is the number of first program loops performed until the threshold voltage of the memory cells increases to a voltage greater than the second verifying voltage in a test operation.

28. The semiconductor memory device of claim 25, wherein the control circuit controls the peripheral circuit to finish the first program loop and perform a second program loop including a second program operation and a second verify operation on memory cells in a second page when the number of memory cells having threshold voltage less than the target voltage is less than the maximum number of error-correctable bits.

29. The semiconductor memory device of claim 25, wherein the control circuit controls the peripheral circuit to perform the first program loop with increasing program voltage when the number of memory cells having a threshold voltage lower than the target voltage exceeds the maximum number of error-correctable bits.

30. The semiconductor memory device of claim 25, wherein the control circuit controls the peripheral circuit to perform a third program loop including the first program operation and a verify operation based on the second verifying voltage and the third verifying voltage when the threshold voltage of every first memory cell is greater than the first verifying voltage according to the first checking operation.

31. The semiconductor memory device of claim 25, wherein the control circuit controls the peripheral circuit to perform a fourth program loop including a first program operation and a verify operation based on the third verifying voltage when the threshold voltage of every second memory cell is greater than the second verifying voltage according to the second checking operation.

32. A semiconductor memory device comprising:
memory cells coupled to a word line;
page buffers coupled to the memory cells through a bit line, configured to temporarily store verifying data obtained by sensing program state of corresponding memory cell and control potential of a sensing node according to the verifying data;
a first checking circuit configured to output the verifying data to a verifying terminal in response to an inputted first checking signal when the number of program operations is performed exceeds a first iteration number; and
a second checking circuit configured to verify completion of the program operation through the verifying data in response to a second checking signal.

33. The semiconductor memory device of claim 32, wherein the second checking signal is inputted when the number of first program loops exceeds a second iteration number greater than the first iteration number.

34. The semiconductor memory device of claim 32, wherein the first checking circuit forms a current path from the verifying terminal to a ground terminal according to the potential of the sensing node and the first checking signal.

35. The semiconductor memory device of claim 34, wherein the first checking circuit includes a first switching element and a second switching element connected in series between the verifying terminal and the ground terminal,
and wherein the first switching element connects the verifying terminal to the second switching element in response to the first checking signal, and the second switching element connects the first switching element to the ground terminal according to the potential of the sensing node.

36. The semiconductor memory device of claim 32, wherein the second checking circuit verifies a number of error bits by comparing a measured amount of current passing through the first checking circuit to a reference current amount in response to the second checking signal.

37. The semiconductor memory device of claim 32, wherein each of the page buffers includes:
a bit line coupling circuit for coupling the bit line to the sensing node;
a precharge circuit for precharging the sensing node; and
a latch circuit for temporarily storing verifying data obtained by sensing the potential of the sensing node, and controlling the potential of the sensing node according to the stored verifying data.

\* \* \* \* \*